United States Patent [19]

Alvarez et al.

[11] Patent Number: 4,811,166

[45] Date of Patent: Mar. 7, 1989

[54] HEAT DISSIPATING MEMBER FOR MOUNTING A SEMICONDUCTOR DEVICE AND ELECTRICAL CIRCUIT UNIT INCORPORATING THE MEMBER

[75] Inventors: Juan M. Alvarez, Medfield; Henry F. Breit, Attleboro; Steven E. Levy, Plainville; Premkumar R. Hingorany, Foxboro, all of Mass.

[73] Assignee: Texas Instruments Incorporated, Dallas, Tex.

[21] Appl. No.: 881,427

[22] Filed: Jul. 2, 1986

[51] Int. Cl.[4] .............................................. H05K 7/20
[52] U.S. Cl. ...................................... 361/386; 357/81
[58] Field of Search ............... 361/386, 388, 400, 408; 357/81

[56] References Cited

U.S. PATENT DOCUMENTS

| 3,097,329 | 7/1963 | Siemens | 357/67 |
|---|---|---|---|
| 3,187,226 | 6/1965 | Kater | 361/388 X |
| 3,351,700 | 11/1967 | Savolainen et al. | 174/506 |
| 3,399,332 | 8/1968 | Savolainen | 351/81 |
| 3,684,464 | 8/1964 | Happ et al. | 128/614 |
| 4,141,029 | 2/1979 | Dromsky | 357/70 |
| 4,283,464 | 8/1981 | Hascoe | 357/81 |
| 4,363,076 | 12/1982 | McIver | 361/408 X |
| 4,472,762 | 9/1984 | Spinelli et al. | 361/388 X |
| 4,480,013 | 10/1984 | Doi et al. | 428/616 |
| 4,546,409 | 10/1985 | Yoshino et al. | 357/81 X |
| 4,546,406 | 10/1985 | Spinelli et al | 361/386 |
| 4,602,314 | 7/1986 | Broadbent | 357/81 X |
| 4,628,407 | 12/1986 | August et al. | 361/388 |

Primary Examiner—G. P. Tolin
Assistant Examiner—A. Jonathan Wysocki
Attorney, Agent, or Firm—James P. McAndrews; John A. Haug; Melvin Sharp

[57] ABSTRACT

A heat dissipating pad or support member for mounting a semiconductor device in an electrical circuit has a metal core with a relatively low coefficient of thermal expansion preferably lower than that of the semiconductor device and has a thermally conducting, corrosion resistant metal coating with relatively greater thermal conductivity than the core. The thermally conducting coating is metallurgically bonded to top, bottom and two lateral surfaces of the core with a selected thickness to cooperate with the core in providing an outer surface portion of the member over the top of the core having an effective coefficient of thermal expansion substantially corresponding to the semiconductor device to reliably mount the semiconductor device thereon. The coating is thicker on at least one of the two lateral core surfaces so that heat collected from the semiconductor device at the top surface of the thermally conducting coating is efficiently transferrred via the lateral surface or surfaces on the core to the portion of the thermally conducting coating on the bottom surface of the member.

11 Claims, 1 Drawing Sheet

HEAT DISSIPATING MEMBER FOR MOUNTING A SEMICONDUCTOR DEVICE AND ELECTRICAL CIRCUIT UNIT INCORPORATING THE MEMBER

BACKGROUND OF THE INVENTION

The field of this invention is that of electrical circuits using semiconductor devices and the invention relates more particularly to mounting semiconductors and electrical circuits with improved reliability and density.

Semiconductor devices such as diodes or integrated circuits or the like are conventionally formed of materials characterized by relatively low coefficients of thermal expansion and some devices such as power semiconductors generate significant amounts of heat when electrically energized. Accordingly when such devices are thermally cycled while fixedly attached to printed circuit boards, differences in thermal expansion between the devices p.c. board materials can cause detachment of the devices from the boards. Similarly build up of heat within the semiconductor devices or p.c. boards tends to limit the densities with which the devices can be accommodated in p.c. board units. As a result a number of different semiconductor mounting arrangements using composite metals have been proposed for providing more reliable device mounting and improved heat-dissipation from the devices. However, although such previously known arrangements have involved substantial expense, they have been less than fully satisfactory in a number of applications in providing reliable device mounting while also providing adequate heat-dissipation from the devices.

BRIEF SUMMARY OF THE INVENTION

It is an object of this invention to provide a novel and improved heat-dissipating member for mounting a semiconductor device; to provide such a member having a surface portion with a coefficient of thermal expansion effectively the same as or selectively matched to a selected semiconductor device for reliably mounting the semiconductor device thereon in fixed relation to the member while providing improved dissipation of heat from the semiconductor device; to provide such an improved heat-dissipating member which is of compact and inexpensive construction; to provide such a heat-dissipating member produced with the desired novel characteristics by a novel process; and to provide novel and improved electrical circuit units incorporating such improved heat-dissipating members.

Briefly described, the novel and improved heat-dissipating member of this invention comprises a metal core having top, bottom and two lateral surfaces. The core is formed of a first metal such as invar having a relatively low coefficient of thermal expansion, preferably substantially lower than the coefficient of thermal expansion of conventional silicon semiconductor integrated circuit devices or the like. A thermally conducting coating of a second metal such as copper or aluminum having a thermal conductivity relatively much greater than the core material is metallurgically bonded not only to the top and bottom surfaces of the core but also to the two lateral surfaces of the core. The thermally conducting coating is relatively thicker on the two lateral core surfaces to facilitate heat-transfer between portions of the thermally conducting coating on the top and bottom surfaces of the core. The thickness characteristics of the coating are selected relative to the core to provide an outer surface portion of the member over the top surface of the core having an effective coefficient of thermal expansion which is substantially the same as or desirably matched to the coefficient of thermal expansion of the selected silicon semiconductor device to be mounted thereon. Preferably the portion of the thermally conducting coating which covers the bottom surface of the core is mounted in heat-transfer relation to a heat-dissipating metal substrate. For example, the member is mounted on a metal support in an automotive vehicle for dissipating heat from the member to the support. Alternately, the member is mounted on a panel board having circuit pad means formed thereon, and leads electrically connect the semiconductor device to the circuit paths to form an electrical circuit unit. Preferably a thin coating of an organic or inorganic material or the like is provided between the semiconductor device and the heat-dissipating member, or between the member and the heat-dissipating p.c. board substrate, for electrically isolating the semiconductor device from the metal components of the electrical circuit unit.

In a preferred embodiment, the heat-dissipating member is provided with the desired novel characteristics by roll flattening a rod of the first metal having a cladding of the second metal metallurgically bonded thereto and by cutting lengths of the flattened rod to form the desired members, the relative diameter or thickness of the rod in cladding being selected with respect to the hardness of the materials so roll flattening to a desired degree forms a member with a core having a relatively thin layer of thermally conducting metal coating on the top and bottom surfaces of the core while also providing relatively much thicker layers of the thermally conducting coating on two laterall surfaces of the core.

DESCRIPTION OF THE DRAWINGS

Other objects, advantages and details of the novel and improved heat-dissipating member for mounting semiconductor devices of this invention and of the novel and improved electrical circuit units of this invention incorporating such heat-dissipating members appear in the following detailed description of preferred embodiments of the invention, a detailed description referring to the drawings in which.

DESCRIPTION OF THE PREFERRED EMBODIMENTS

Figure 1:
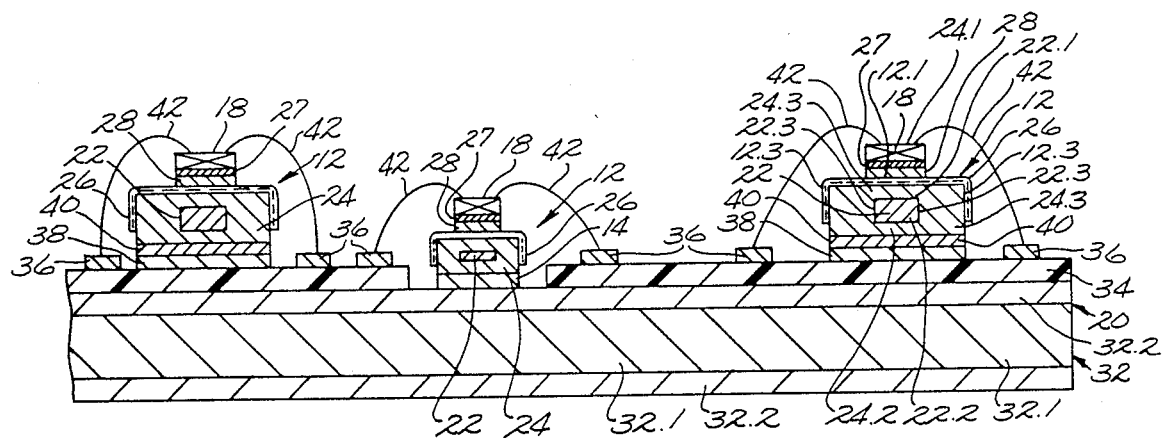
FIG. 1 is a section view to enlarged scale along an axis of an electrical circuit unit of this invention incorporating novel and improved heat-dissipating members of this invention.

Referring to the drawings, 10 in FIG. 1 indicates a novel and improved electrical circuit unit of this invention which is shown to comprise a novel and improved heat-dissipating members 12 for mounting semiconductor devices 18 such as silicon semiconductor integrated circuit units on a panel board 20 of generally conventional design. The semiconductor devices 18 are of any conventional type including discrete devices such as diodes or triacs or the like as well as different types of integrated circuit units and, although the semiconductor devices are not further described herein, it will be understood that the devices embody silicon materials and the like and have relatively low coefficient of thermal expansion on the order of 2.0 to $6.0 \times 10^{-6}$ in./in./°C. within the scope of this invention and that the devices generate significant amounts of heat when electrically energized such that it is desirable to rapidly withdraw that heat from the devices and to dissipate the heat from the local devices to improve performance, reliability and service life under the sometimes high ambient operating conditions likely to be encountered by the electrical circuit unit 10.

In one preferred embodiment of the heat-dissipating member 12 of this invention, a core 22 of a first metal comprises a metal material having a relatively low coefficient of thermal expansion preferably relatively lower than the coefficient of thermal expansion of a selected silicon semiconductor device to be mounted in a circuit unit of this invention. Preferably the core metal is selected from the group consisting of the following materials:

conducting coating materials are also used within the scope of this invention.

In a preferred embodiment, where the semiconductor device 18 mounted on the member 12 comprises a silicon semiconductor integrated circuit unit having a coefficient of thermal expansion of about $4.0 \times 10^{-6}$ in./°C., the member 12 comprises an Alloy 42 core 22 having a width of 0.340 inches and a thickness of 0.027 inches and the thermally conducting coating 24 is formed of copper having a thickness of 0.0125 inches over the top and bottom core surfaces and a thickness of 0.225 inches over the lateral core surfaces, the member having a length of 0.890 inches such that the member has a generally square configuration, the outer surface portion 12.1 of the member having an effective coefficient of thermal expansion $9.0 \times 10^{-6}$ in./in./°C. However core and coatings of other proportions are also used within the scope of this invention for providing a desired effective thermal expansion coefficient at the

TABLE I

| MATERIAL DESIGN. | NOMINAL COMPOSITION (WEIGHT %) | | | THERMAL CONDUCTIVITY BTU/SQ.FT/HR/IN/°F. | COEFFICIENT OF THERMAL EXPANSION |
| --- | --- | --- | --- | --- | --- |
| | Cobalt | Nickel | Iron | | |
| Kovar | 17 | 29 | Bal. | 98 | $5.5 \times 10^{-6}$ in./in./°C. |
| Alloy 42 | — | 42 | Bal. | 106 | $5.3 \times 10^{-6}$ in./in./°C. |
| Invar | — | 36 | Bal. | 72-6 | $1.4 \times 10^{-6}$ in./in./°C. |
| Molybdenum | — | — | — | 900 | $2.8 \times 10^{-6}$ in./in./°C. |

Other low thermal expansion core materials are also used within the scope of this invention.

As illustrated the core has top, bottom and two lateral surfaces 22.1, 22.2 and 22.3 respectively and in accordance with this invention a thermally conducting coating 24 of a second metal having relatively greater thermal conductivity than the core material is metallurgically bonded not only to the top and bottom surfaces of the core but also to the two lateral surfaces of the core. Preferably the coating on the top core surface has at least a minimum thickness in the range from about 0.005 to 0.010 inches to assure that there is an adequate heat flow path along the top portions of the coating between all parts of a semiconductor device leading to the thermally conducting coating material on the lateral surfaces of the core. Portions 24.3 of the thermally conducting coating on the lateral core surfaces are thicker than the portions 24.1, 24.2 of the coating over the respective top and bottom surfaces of the core for providing the member with improved heat-dissipating properties in a compact device as is described below. The thickness characteristics of the thermally conducting coating are also selected relative to the core for providing an outer surface portion 12.1 of the member with an effective coefficient of thermal expansion substantially the same as or desirably matched to the semiconductor device 18 mounted on the member. In a preferred embodiment, the thermally conducting coating 24 is formed of a metal selected from the group consisting of the following materials:

outer surface portion 12.1 to mount a semiconductor device thereon and to provide thermally conducting coating layers of desired thickness on the lateral surfaces of the core as above described.

In a preferred embodiment, a thin electrically insulating coating 26 is provided on the member 12 over the outer surface portion 12.1 and preferably the insulating coating extends over lateral surfaces 12.3 of the member as shown in FIG. 1. The insulating coating is formed of an organic material such as a polyimide or a polyimide loaded with alumina or boron nitride particles or the like or is formed of an inorganic porcelain enamel or ceramic material or the like within the scope of this invention. Preferably for example a ceramic precursor material is coated on the member with an organic binder which is fired in situ on the member for burning off the binder and for forming and adhering a ceramic coating to the member. In preferred embodiments, the insulating coating comprises alumina having a coefficient of thermal expansion of about $6.5 \times 10^{-6}$ in./in./°C. providing selected matching to the coefficient of thermal expansion of the outer surface portion 12.1 of the member and to a semiconductor device to be mounted thereon, but if desired for matching other coefficients of thermal expansion or for other purposes other ceramic materials such as silica, berrylia, or aluminum nytride or the like are also used. With such insulating coatings, a thin metal pad 28 of copper or the like is deposited on the insulating coating and the semiconductor device 18 is secured to that pad by a layer of solder or an epoxy

TABLE II

| MATERIAL DESGINATION | THERMAL CONDUCTIVITY BTU/SQ.FT./HR./°F. | COEFFICIENT OF THERMAL EXPANSION |
| --- | --- | --- |
| Copper | 2512 | $16 \times 10^{-6}$ in./in. °C. |
| Aluminum | 1540 | $23 \times 10^{-6}$ in./in. °C. |

As will be understood, such materials are corrosion resistant and the copper based materials are also adapted for easy soldering or the like. Other thermally adhesive or the like in conventional manner. Typically for example the coating is formed of alumina and has a thickness of about 0.002 inches.

Figure 2:
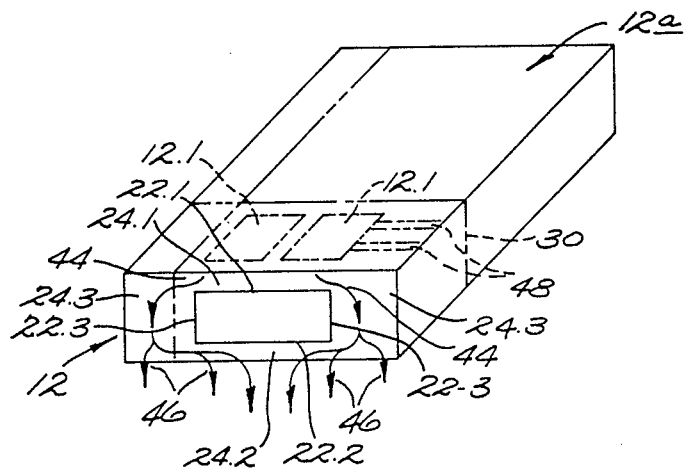
FIG. 2 is perspective view of a preferred embodiment of a heat-dissipating member of this invention.

In a preferred embodiment of this invention, improved heat-dissipating members 12 for mounting semiconductor devices 18 are economically formed with the desired novel characteristics by providing a substantially round rod 22a of the first or low expansion core metal having a cladding 24a of the second or thermally conducting coating metal metallurgically bonded to the core rod of a substantially uniform thickness as illustrated in FIG. 2. The clad rod is passed between pressure squeezing rolls as diagrammatically illustrated at 29 in FIG. 3 for flattening the clad rod. As metallurgically bonded clad rods are known, they are not further described herein and it will be understood that, in accordance with this invention, the diameter or cross section of the rod is preferably selected relative to the thickness and other properties of the cladding metal and with respect to the degree of flattening to be performed so that a length of flattened clad rod is formed as illustrated at 12a in FIG. 3 such that a desired length of the flat rod is easily cut off in any conventional manner as diagrammatically illustrated by the broken line 30 for forming the desired heat transmitting member 12 and so that portions of the thermally conducting coating 24.3 on the lateral surfaces of the core metal are relatively thicker than the portions of the thermally conducting coating 24.1, 24.2, on the top and bottom surfaces of the member. Preferably for example, an Alloy 42 rod having a diameter of about 0.187 inches and having a metallurgically bonded copper cladding of about 0.116 inches thickness in half hardened condition is roll squeezed and flattened with approximately 68 percent reduction and elongation therein for providing a member 12 having the examplory dimensions as previously described.

In a preferred embodiment of the electrical circuit unit 10, the panel board 20 comprises a heat-dissipating metal substrate 32 and the bottom surface of the thermally conducting coating 24.2 is arranged to rapidly transfer heat from the member 12 to the substrate. Such a substrate can comprise a metal support in an automotive vehicle for rapidly dissipating heat from the member into that support. If desired, the semiconductor device or devices mounted on the members are electrically connected to the substrate. In a preferred embodiment, for example, the heat-dissipating substrate 32 embodies a layer of metal 32.1 selected from the materials of Table I having a relatively low coefficient of thermal expansion and a layer of metal 32.2 selected from the materials of Table II of relatively high thermal conductivity metallurgically bonded to respective opposite sides of the low expansion layer 32.1. An electrically insulating layer 34 of an epoxy or the like is bonded to one side of the metal laminate 32 and circuit pads formed of copper foil or the like are secured in electrically insulated relation to each other on the insulating coating 34 as is diagrammatically indicated at 36 in FIG. 1. Preferably also copper foil pads 38 are also provided on the panel board for mounting the semiconductors 18 thereon. In one embodiment of this invention, the heat-dissipating member 12 as above described is secured in heat-transfer relation to the panel board 20 by mounting the member 12 on a pad 38 as illustrated in FIG. 1. That is, the bottom portion 24.2 of the thermally conducting coating on the member is soldered or adhesively secured to a pad 38 as indicated at 40 in FIG. 1 while leads extend from the semiconductor device 18 (from terminals not shown) to connect the semiconductor device to selected circuit pads 36 on the circuit board as indicated at 42 in FIG. 1. Preferably a thermally conducting adhesive 40 of any conventional type is used for mounting the heat-dissipating member to the panel board pad 38.

If desired, the heat-dissipating member 12 is secured directly to the heat-dissipating substrate 32 in the panel board 20 by use of a solder or thermally conducting adhesive or the like as indicated at 14 in FIG. 1 for achieving improved heat-transfer from the member 12 to the substrate.

Figure 3:
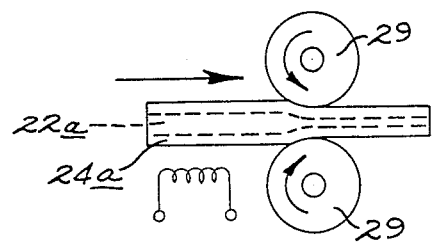
FIG. 3 is a diagrammatic view illustrating a step informing the heat-dissipating member of FIG. 2.

In that arrangement, the electrical circuit unit 10 incorporates a panel board 20 of known type for mounting the semiconductor device 18 and the heat-dissipating member 12 serves to mount the device on the panel board with improved reliability due to improved matching of thermal coefficient of expansion and with improved dissipation of heat from the device by provision of the relatively thicker layers of the thermally conducting coating in the member on the lateral surfaces of the core. That is, as is indicated by arrows 44 in FIG. 2, the top portion 24.1 of the thermally conducting coating on the member 12 rapidly conducts heat away from a semiconductor device 18 mounted on the outer surface portion 12.1 of the number 12. That heat is rapidly transferred from the top surface of the member through the relatively thicker lateral portions 24.3 of the thermally conducting coating and is rapidly distributed by the bottom coating portion 24.2 to the panel board 20 as indicated by the arrows 46 in FIG. 3. In that way use of the members 12 provides for improved performance, reliability and service life of the components in the circuit unit 10. Attachment of the semiconductor device is in the circuit unit is improved in reliability and better heat-dissipation from the devices and from the local of the devices via the improved heat-dissipating members 12 provide improved performance and service life. The heat-dissipating members 12 are easily formed at low cost with the desired thermal expansion and other characteristics as above described. If desired, the heat-dissipating member 12 is adapted to accommodate a plurality of semiconductor devices thereon as is diagrammatically indicated by the additional surface portion 12.1 indicated in FIG. 3 and if desired circuit pads is diagrammatically illustrated at 48 in FIG. 3 are also provided in electrically insulated relation to each other and to the member. However for best results each heat-dissipating member 12 is preferably adapted to mount a single one or a limited number of devices 18 thereon.

It should be understood that although particular embodiments of the invention have been described by way of illustrating the invention, this invention includes all modifications and equivalence of the disclosed embodiments falling within the scope of the appended claims.

We claim:

1. A heat dissipating member for mounting a semiconductor device comprising a metal core having top, bottom and two lateral surfaces formed of a first metal having a selected coefficient of thermal expansion and a predetermined thermal conductivity, and a thermally conducting outer metal coating which is metallurgically bonded to top, bottom and two lateral surfaces of the core so that one portion of the coating extends over the top surface of the core, another portion of the coating extends over the bottom surface of the core, and portions of the coating on the lateral surfaces of the core extend in heat-transfer relation between portions of the coating on the top and bottom of the core being formed of a second metal having a thermal conductivity relatively greater than said predetermined thermal conductivity and a coefficient of thermal expansion relatively greater than said selected coefficient of thermal expansion, the coating on the top surface of the core having selected thickness characteristics relative to the core and being metallurgically bonded to the core cooperating with the core in providing an outer surface portion of the coating over the top core surface having a predetermined effective coefficient of thermal expansion which is substantially less than the coefficient of thermal expansion of the coating material for reliably mounting a semiconductor device thereon and having relatively greater thickness of said thermally conducting coating on at least one lateral surface of the core than on the top surface of the core providing improved heat dissipation via heat transfer from the thermally conductive coating on the top and lateral surfaces of the core to the thermally conductive coating on the bottom surface of the core.

2. A heat dissipating member which is adapted to mount a semiconductor device, the member comprising a metal core having top, bottom and two lateral surfaces formed of a first metal having a selected coefficient of thermal expansion and a predetermined thermal conductivity, and a thermally conducting outer metal coating which is metallurgically bonded to top, bottom and two lateral surfaces of the core so that one portion of the coating extends over the top surface of the core, another portion of the coating extends over the bottom surface of the core, and portions of the coating on the lateral surfaces of the core extend in heat-transfer relation between portions of the coating on the top and bottom of the core, the coating being formed of a second metal having a thermal conductivity relatively greater than said predetermined thermal conductivity and a coefficient of thermal expansion relatively greater than said selected coefficient of thermal expansion, the coating having selected thickness characteristics relative to the core at the top of the core metallurgically bonded to the core cooperating with the core in providing an outer surface portion of the coating over the top core surface having a predetermined effective coefficient of thermal expansion which is substantially less than the coefficient of thermal expansion of the coating material to be adapted to mount a semiconductor device thereon and having relatively greater thickness of said thermally conducting coating on at least one lateral surface of the core than on the top surface of the core for providing improved heat dissipation from such a semiconductor device via heat transfer from the thermally conductive coating on the top and lateral surfaces of the core to the thermally conductive conductive coating on the bottom surface of the core, the member being produced by the method comprising steps of providing a rod of the first metal of a selected diameter having a cladding of selected uniform thickness of the second metal metallurgically bonded to the rod, flattening the clad rod to an extent selected with respect to the diameter and hardness of the rod relative to the thickness and hardness of the cladding for forming said core and said coating such that the coating has said relatively greater thickness on a pair of opposite lateral surfaces of the core than on the top surface of the core, and cutting a length of the flattened clad rod for forming the member.

3. A heat-dissipating member produced by the method according to claim 2 as further modified by the method step of cutting a portion of the cladding of the flattened clad rod from one lateral surface of the core for forming the member.

4. A heat-dissipating member according to claim 2 having an electrically insulating material attached to said outer surface portion of the member.

5. A heat-dissipating member according to claim 1 wherein the first metal comprises an alloy selected from the group consisting of metals having nominal compositions by weight of 17 percent cobalt, 29 percent nickel and the balance iron, of 42 percent nickel and the balance iron, of 36 percent nickel and the balance iron, and molybdenum and the second metal comprises a metal selected from the group consisting of copper and aluminum.

6. An electrical circuit unit comprising a semiconductor device having a selected coefficient of thermal expansion, and a heat dissipating member mounting the semiconductor device thereon, characterized in that the heat dissipating member comprises a metal core having top, bottom and two lateral surfaces formed of a first metal having a predetermined coefficient of thermal expansion and a predetermined thermal conductivity, and a thermally conducting outer metal coating which is metallurgically bonded to top, bottom and two lateral surfaces of the core so that one portion of the coating extends over the top surface of the core, another portion of the coating extends over the bottom surface of the core, and portions of the coating on the lateral surfaces of the core extend in heat-transfer relation between portions of the coating on the top and bottom of the core, the coating being formed of a second metal having a thermal conductivity relatively greater than said predetermined thermal conductivity and a coefficient of thermal expansion relatively greater than said predetermined coefficient of thermal expansion, the coating on the top surface of the core having selected thickness characteristics relative to the core and being metallurgically bonded to the top surface of the core cooperating with the core in providing and outer surface portion of the coating over the top core surface having an effective coefficient of thermal expansion substantially closer to said selected coefficient of thermal expansion of the semiconductor device reliably mounting the semiconductor device on said outer surface portion during thermal cycling of the semiconductor device, the thermally conducting metal coating having relatively greater thickness on at least one lateral surface of the core than on the top surface of the core providing improved heat dissipation via heat transfer from the thermally conductive coating on the top and lateral surface of the core to the thermally conductive coating on the bottom surface of the core.

7. An electrical circuit unit produced by the method comprising the steps of providing a semiconductor device having a selected coefficient of thermal expansion, and mounting the semiconductor device on a heat-dissipating member, characterized in that the heat dissipating member comprises a metal core having top, bottom and two lateral surfaces formed of a first metal having a predetermined coefficient of thermal expansion and a predetermined thermal conductivity, and a thermally conducting outer metal coating which is metallurgically bonded to top, bottom and two lateral surfaces of the core so that one portion of the coating extends over the top surface of the core, another portion of the coating extends over the bottom surface of the core, and portions of the coating on the lateral surfaces of the core extend in heat-transfer relation between portions of the coating on the top and bottom of the core, the coating being formed of a second metal having a thermal conductivity relatively greater than said predetermined thermal conductivity and a coefficient of thermal expansion relatively greater than said predetermined coefficient of thermal expansion, the coating having selected thickness characteristics relative to the core cooperating with the core in providing an outer surface portion of the coating over the top core surface having an effective coefficient of thermal expansion relatively closer to said selected coefficient of thermal expansion reliably mounting the semiconductor device on said outer surface portion during thermal cycling of the semiconductor device, the thermally conducting metal coating having relatively greater thickness on at least one lateral surface of the core than on the top surface of the core providing improved heat dissipation from the semiconductor device via heat transfer from the thermally conductive coating on the top and lateral surfaces of the core to the thermally conductive coating on the bottom surface of the core, the heat-dissipating member being produced by the method comprising the steps of providing a rod of the first metal of a selected diameter having a cladding of selected uniform thickness of the second metal metallurgically bonded to the rod, flattening the clad rod to an extent selected with respect to the diameter and hardness of the rod relative to the thickness and hardness of the cladding for forming said core and said coating such that the coating has said relatively greater thickness on a pair of opposite lateral surfaces of the core than on the top surface of the core.

8. An electrical circuit unit according to claim 7 further characterized in that an electrically insulating coating is provided on the member over said outer surface portion thereof between the member and the semiconductor device mounted thereon.

9. An electrical circuit unit according to claim 6 having a heat-dissipating metal substrate and having the bottom surface portion of the heat-dissipating member secured in heat-transfer relation to the substrate.

10. An electrical circuit unit according to claim 6 having a panel board comprising a heat-dissipating metal substrate and circuit path means formed thereon, having the bottom surface portion of the heat-dissipating member secured in heat-transfer relation to the panel board, and having lead means electrically connecting the semiconductor device to said circuit pad means.

11. An electrical circuit unit according to claim 9 wherein a layer of electrically insulating material is secured to the heat-dissipating metal substrate and circuit pads means are formed on said electrically insulating layer in electrically insulated relation to the metal substrate, and wherein the bottom surface of the heat-dissipating member is secured directly to the heat-dissipating metal substrate in the panel board.

* * * * *